Figure 3:
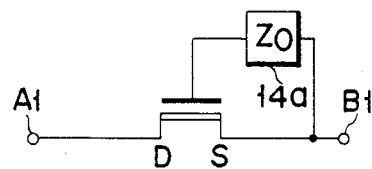

United States Patent [19]

Iida et al.

[11] Patent Number: 4,489,245
[45] Date of Patent: Dec. 18, 1984

[54] D.C. VOLTAGE BIAS CIRCUIT IN AN INTEGRATED CIRCUIT

[75] Inventors: Tetsuya Iida; Tatsuo Sakaue, both of Yokohama, Japan

[73] Assignee: Kabushiki Kaisha Toshiba, Japan

[21] Appl. No.: 598,406

[22] Filed: Apr. 11, 1984

Related U.S. Application Data

[63] Continuation-in-part of Ser. No. 274,516, Jun. 17, 1981, abandoned.

[30] Foreign Application Priority Data

Sep. 10, 1980 [JP] Japan .................. 55-125756

[51] Int. Cl.³ ................. H03K 17/16; H03F 1/52
[52] U.S. Cl. .................. 307/296 R; 307/304; 330/296; 330/302; 357/23
[58] Field of Search .......... 307/296 R, 491, 501, 307/556, 303, 304; 330/261, 296, 302, 306; 357/23 GP

[56] References Cited

U.S. PATENT DOCUMENTS

| 3,417,464 | 12/1968 | Fang et al. ............ 357/230 X |
| 3,775,693 | 11/1971 | Proebsting ............ 307/304 X |
| 3,819,952 | 6/1974 | Enomoto et al. ........ 357/23 GP X |
| 3,913,026 | 10/1975 | Koehler .............. 307/304 X |
| 3,942,047 | 3/1976 | Buchanan ............. 307/303 X |
| 4,161,664 | 7/1979 | Kawagoe et al. ........ 307/296 R X |
| 4,282,556 | 8/1981 | Ipri ................. 357/23 GP X |
| 4,288,829 | 9/1981 | Tango ............... 357/23 GP X |
| 4,438,449 | 3/1984 | Usuda ............... 357/23 GP X |

FOREIGN PATENT DOCUMENTS

| 18767 | 11/1980 | European Pat. Off. . |
| 2538361 | 3/1977 | Fed. Rep. of Germany . |
| 116887 | 9/1979 | Japan ............... 357/23 GP |
| 140482 | 10/1979 | Japan ............... 357/23 GP |
| 1142 | 1/1980 | Japan ............... 357/23 GP |
| 5750109 | 3/1982 | Japan . |
| 1534521 | 12/1978 | United Kingdom . |
| 1542239 | 3/1979 | United Kingdom . |
| 2030398 | 4/1980 | United Kingdom . |
| 1573771 | 8/1980 | United Kingdom . |

OTHER PUBLICATIONS

Mead and Conway, Introduction to VLSI Systems, Addison-Wesley Pub. Co., Mass., Oct. 1980, pp. 33-37.

Primary Examiner—Stanley D. Miller
Assistant Examiner—David R. Hudspeth
Attorney, Agent, or Firm—Finnegan, Henderson, Farabow, Garrett & Dunner

[57] ABSTRACT

In an integrated circuit having an amplifier with its input terminal connected to a signal input terminal, a D.C. voltage bias circuit is provided which includes a D.C. bias voltage generator and a depletion mode MOS transistor connected at its source-drain path between the bias voltage generator and the signal input terminal and coupled at its gate electrode to either its source or its drain thus preventing breakdown of the gate insulating film of the depletion mode MOS transistor resulting from a surge voltage from the signal terminal.

3 Claims, 4 Drawing Figures

F I G. 1
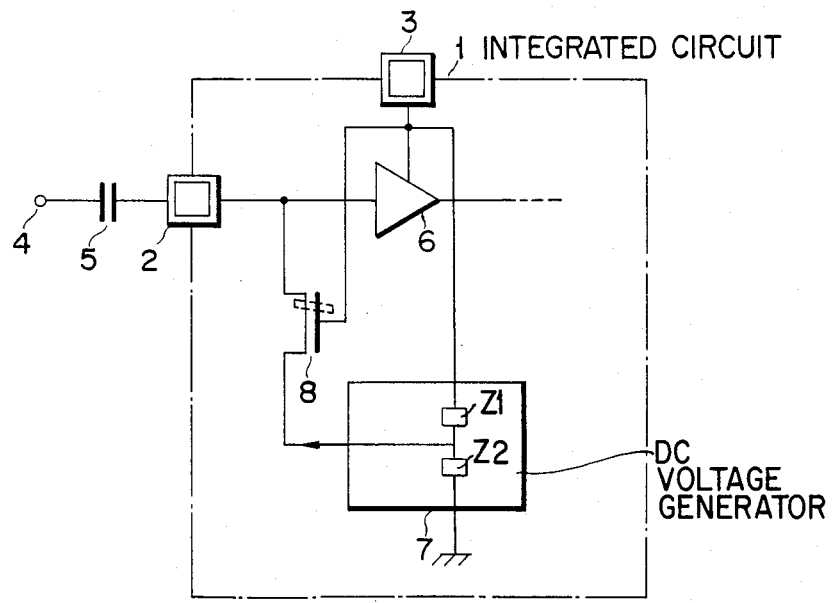
F I G. 2
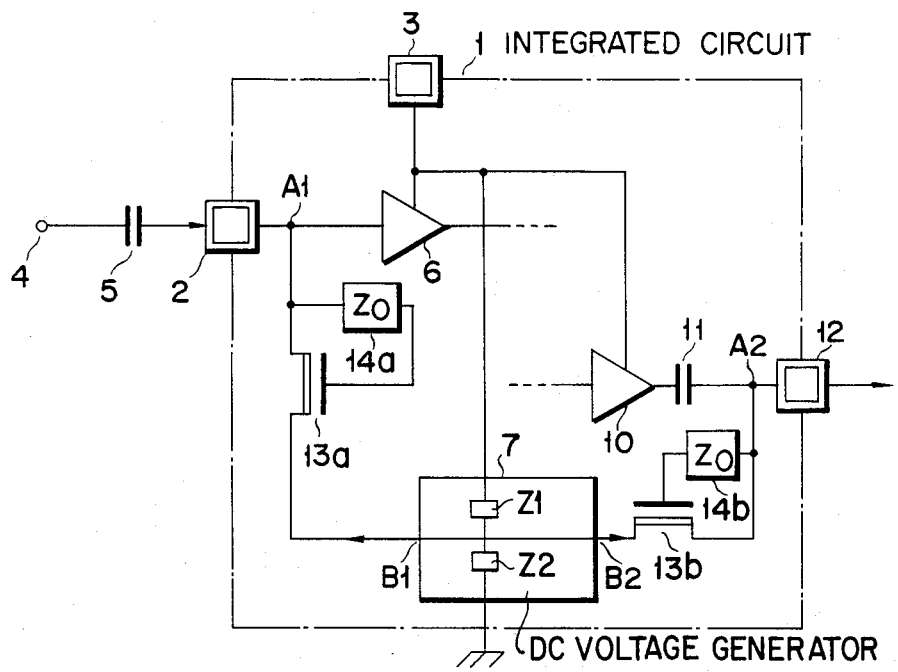

4,489,245

D.C. VOLTAGE BIAS CIRCUIT IN AN INTEGRATED CIRCUIT

This application is a continuation-in-part, of application Ser. No. 274,516, filed June 17, 1981, now abandoned.

This invention relates to a D.C. voltage bias circuit in an integrated circuit including MOS transistors, which provides a D.C. voltage bias to an element included in the integrated circuit.

Occasion arises where it is necessary to impress suitable D.C. voltage bias on an active element, for example, an amplifier element in an integrated circuit or an output signal therefrom. In such case, a D.C. voltage bias circuit may have an arrangement indicated in FIG. 1. An integrated circuit 1 of FIG. 1 including MOS transistors is provided with an input signal terminal 2 and a power supply terminal 3. The input signal terminal 2 is supplied with an A.C. input signal through a capacitor 5 for coupling an external input signal supply terminal 4 to the input signal terminal 2 of the integrated circuit 1. An active element included in the integrated circuit 1, for example amplifier element 6, is impressed with drive voltage delivered from the power supply terminal 3, amplifies a signal supplied through the input signal terminal 2, and issues an amplified signal. Proper D.C. voltage bias has to be applied to the amplifier element 6 since the input signal at terminal 2 does not contain any D.C. components.

A conventional D.C. voltage bias circuit may be constructed, as shown in FIG. 1, by connecting an enhancement mode MOS transistor 8 between a D.C. voltage generator 7 for producing a desired D.C. bias voltage and the input signal terminal 2 and connecting the gate of the enhancement mode MOS transistor 8 to the power supply terminal 3:

Since the A.C. signal from terminal 2, after being divided by the ratio between the impedance of the coupling capacitor 5 and that of transistor 8, is supplied to the input terminal of amplifier 6, the level of the input signal to the amplifier is attenuated unless the impedance of transistor 8 is set to a level above the predetermined level. As shown in FIG. 1, D.C. voltage generator 7 has a known arrangement which includes a first impedance $Z_1$, connected between the bias voltage output terminal of generator 7 and the power supply terminal 3 and also includes a second impedance $Z_2$ connected between the bias voltage output terminal and a ground terminal.

Since transistor 8 is an enhancement type, it cannot be made conductive at its source-drain path with the gate electrode connected to the source or the drain when integrated circuit 1 is in its operation state. It is therefore necessary to connect the gate electrode of transistor 8 to power supply terminal 3. However, the input signal terminal 2 and power supply terminal 3 are drawn out of the integrated circuit. Where, therefore, a high voltage is impressed between these two terminals by some cause (including a case where a man touches his hand between the terminals 2 and 3), the gate of the MOS transistor 8 is statically damaged by the transient surge voltage. As a result, a current path is formed as indicated in a broken line in FIG. 1 between the gate and source-drain path of the MOS transistor 8. Where a voltage of several hundreds of volts is actually impressed across the input signal terminal 2 and power supply terminal 3, the gate of the MOS transistor 8 is destroyed. In such case, power source voltage is impressed on the input terminal of the amplifier 6 through the power supply terminal 3 and MOS transistor 8. Consequently the amplifier 6 fails to carry out amplification as prescribed.

It is accordingly the object of this invention to provide a D.C. voltage bias circuit for use with an integrated circuit provided with an MOS transistor whose gate is not connected to a power supply terminal of the integrated circuit.

To achieve the foregoing object and in accordance with the purpose of the invention, as embodied and broadly described herein, in an integrated circuit having a signal input terminal which receives an input signal through a coupling capacitor; having an amplifier connected to a power supply terminal having an amplifier input terminal connected to the signal input terminal and having an amplifier output terminal connected to a semiconductor element provided in the integrated circuit; and having a D.C. voltage generator which includes a bias voltage output terminal, a first impedance connected between the bias voltage output terminal and the power supply terminal, a second impedance connected between the bias voltage output terminal and a ground terminal, a D.C. voltage bias circuit comprising a third impedance and a depletion mode MOS transistor connected at its source-drain path between the bias voltage output terminal of the D.C. voltage generator and the signal input terminal and coupled at its gate electrode to either its source or its drain through the third impedance.

This invention can be more fully understood from the following detailed description when taken in conjunction with the accompanying drawings, in which:

FIG. 1 schematically indicates the arrangement of an integrated circuit including a D.C. voltage bias circuit which may be used as an example;

FIG. 2 schematically indicates the arrangement of an integrated circuit including a D.C. voltage bias circuit according to one embodiment of this invention;

FIG. 3 is a modification of the D.C. voltage bias circuit of FIG. 2; and

Figure 4:
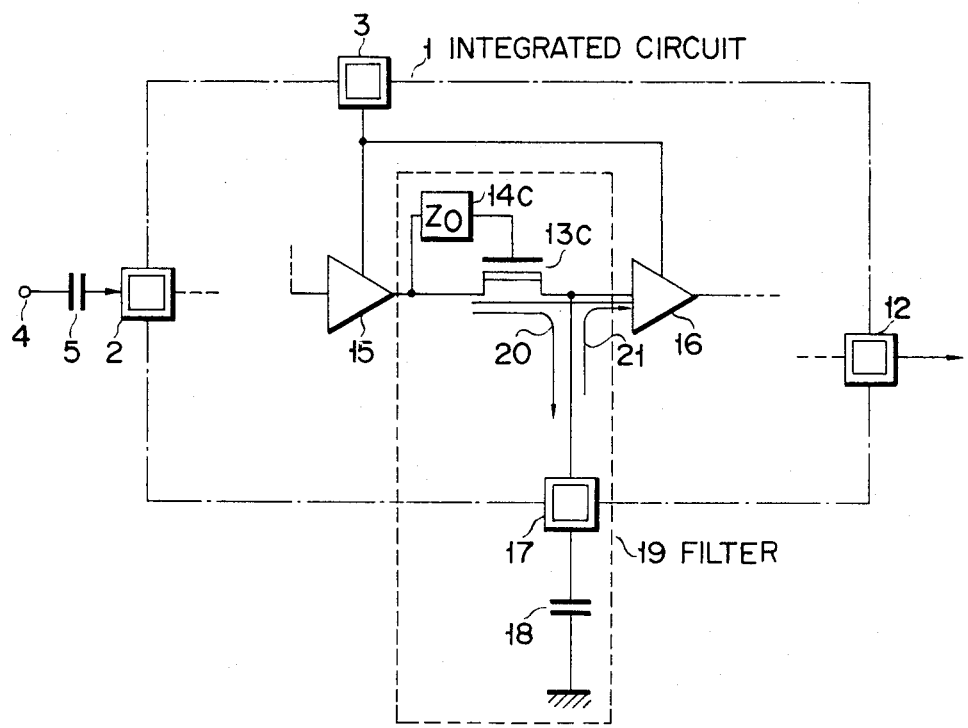

FIG. 4 schematically sets forth a D.C. voltage bias circuit according to another embodiment of the invention.

Throughout the embodiments, the same parts are denoted by the same numerals given in FIG. 1. Referring to FIG. 2, an input signal to be supplied to an integrated circuit 1 is conducted to an amplifier 6 through an input signal supply terminal 4 provided outside of the integrated circuit 1, an input signal coupling capacitor 5, and, in turn, to an input signal terminal 2 of the integrated circuit 1. The amplifier 6 is impressed with power source voltage through a power supply terminal 3. Another amplifier 10 amplifies its input signal, and the output signal therefrom is drawn out of the integrated circuit 1 through an output signal coupling capacitor 11 and output signal terminal 12. The amplifier 10 is connected to the power supply terminal 3.

An N or P channel type depletion mode MOS transistor 13a is connected between a D.C. voltage generator 7 and the input signal terminal 2, that is, the input terminal of the amplifier 6. The gate of the MOS transistor 13a is connected to the drain thereof through an impedance element 14a having an impedance $Z_0$.

A depletion mode MOS transistor 13b of an N or P channel type is connected between the D.C. voltage generator 7 and output signal terminal 12. The gate of the MOS transistor 13b is connected to the drain thereof through an impedance element 14b having an impedance $Z_0$. The arrangement of D.C. voltage generator 7 in FIG. 2 is similar to that shown in FIG. 1. The first MOS transistor 13a including an impedance element 14a constitutes a D.C. voltage bias circuit for the amplifier 6. The MOS transistor 13b constitutes a D.C. voltage bias circuit for giving a D.C. bias voltage on an output signal from the amplifier 10.

The depletion mode MOS transistors 13a and 13b in FIG. 2 can be respectively set to have a prescribed level of impedance. The gates of the MOS transistors 13a and 13b are not connected to the power supply terminal 3. Even when, therefore, a high voltage is impressed between the power supply terminal 3 and the input terminal 2 or between the power supply terminal 3 and the output signal terminal 12, no current path is produced between the gate and drain or between the gate and source of the respective MOS transistors 13a and 13b. Consequently, a D.C. voltage bias having a prescribed level can be supplied to the input of the amplifier 6 or the output of the amplifier 10, thereby elevating the reliability of the integrated circuit 1.

With the integrated circuit 1 in its operation state, the source-drain path of transistor 13a is always in the conductive state. Here it is to be noted that the value of the impedance is determined such that the A.C. signal is supplied from terminal 2 to amplifier 6 without being attenuated. As known, there always exists a gate capacitance C between the gate electrode and the source-drain path of the transistor.

If the integrated circuit 1 is in the non-operation state and a transient surge voltage is accidentally impressed between the terminal 2 and the power supply terminal 3, the transient surge voltage impressed between terminal 2 and terminal 3 will be applied across a series circuit comprising terminal 2, $Z_0$, C, $Z_1$, and terminal 3, assuming that resistance between the drain and the source is set sufficiently greater than the impedance $Z_0$. If the impedance $Z_0$ (with $Z_1$ being much less than $Z_0$) is not connected to transistor 13a, then, at the time in which the transient surge voltage rises, the transient surge voltage will be applied only across gate capacitance C. As a result, the gate insulation of transistor 13a will break down, and thus the object of this invention is not obtained. However, where the impedance $Z_0$ is set such that $Z_0$ is much greater than $Z_1$, the transient surge voltage is applied only across $Z_0$ at the time in which the transient surge voltage rises. A static voltage applied across $Z_0$ is gradually increased thereby preventing a breakdown of transistor 13a. If $Z_1$ is set much greater than $Z_0$, the value of $Z_0+Z_1$ becomes even greater thus making it possible to obtain the above-mentioned object without having $Z_0$ be greater than $Z_1$.

The D.C. voltage bias circuit connected between the output terminal 12 and the output $B_2$ of the D.C. voltage generator 7 has the same function as that explained above. In this case, transistor 13b is prevented from being broken down even when a transient surge voltage is accidentally impressed between power supply terminal 3 and output terminal 12.

It is possible to omit either of the MOS transistors 13a and 13b of FIG. 2. FIG. 2 denotes the embodiment where the gate of, for example, the MOS transistor 13a is connected to the drain thereof through an impedance element 14a. However, as shown in FIG. 3, the gate of the MOS transistor 13a may be connected to the source thereof through the impedance element 14a. Or as shown in FIG. 3, the gate the MOS transistor 13a may be directly connected to the drain thereof. Or as seen from FIG. 3, the gate of the MOS transistor 13a may be directly connected to the source thereof.

Description is now given with reference to FIG. 4 of a D.C. voltage bias circuit according to a second embodiment of this invention. An N or P channel type depletion mode MOS transistor 13c is connected between the output terminal of a first amplifier 15 included in the integrated circuit 1 and a filter terminal 17. The gate of the MOS transistor 13c is connected to the source thereof through an impedance element 14c. The filter terminal 17 is connected to the input of a second amplifier 16, and further is grounded through a D.C.-blocking capacitor 18.

The MOS transistor 13c including the impedance element 14c, filter terminal 17, and D.C.-blocking capacitor 18 jointly constitute a low pass filter designated 19 in FIG. 4. Namely, an A.C. component of the output signal from the first amplifier 15 is conducted in the direction of an indicated arrow 20. A D.C. component of the output signal of the first amplifier 15 is impressed as a D.C. bias voltage on the input of the second amplifier 16 through a path indicated by an arrow 21.

With the second embodiment shown in FIG. 4, the depletion mode MOS transistor 13c is also connected between the first amplifier 15 and filter terminal 17. The gate of the MOS transistor 13c is connected to the source thereof through the impedance element 14c. However, the gate of the MOS transistor 13c may be connected to the drain thereof through the impedance element 14c.

Since the reference numeral 19 in FIG. 4 denotes a low pass filter, these signals of the output signals from the first amplifier 15 whose frequency is lower than prescribed is supplied to the second amplifier 16. On the other hand, those signals of the output signals from the first amplifier 15 whose frequency is higher than prescribed is absorbed in the D.C.-blocking capacitor 18 through a path indicated by the arrow 20. Where, therefore, the low pass filter 19 has a sufficiently large time constant, the D.C. component of the output signal of the first amplifier 15 is impressed on the input of the second amplifier 16 as a D.C. bias voltage through a path indicated by the arrow 21.

If the gate of the MOS transistor 13c were connected to the power supply terminal 3 and high voltage were to be impressed between the power supply terminal 3 and filter terminal 17, then the gate of the MOS transistor 13c would be statically destroyed. As a result, the second amplifier 16 would fail to operate as prescribed. With the second embodiment shown in FIG. 4, however, the gate of the MOS transistor 13c is not connected to the power supply terminal 3, thereby suppressing the occurrence of the above-mentioned accident.

What we claim is:

1. In an integrated circuit having a signal input terminal which receives an input signal through a coupling capacitor; having an amplifier connected to a power supply terminal having an amplifier input terminal connected to said signal input terminal and having an amplifier output terminal connected to a semiconductor element provided in said integrated circuit; and having a D.C. voltage generator which includes a bias voltage output terminal, a first impedance connected between said bias voltage output terminal and said power supply terminal, a second impedance connected between said bias voltage output terminal and a ground terminal, a D.C. voltage bias circuit comprising:
- a third impedance; and
- a depletion mode MOS transistor connected at its source-drain path between said bias voltage output terminal of said D.C. voltage generator and said signal input terminal and coupled at its gate electrode to either its source or its drain through said third impedance.

2. In an integrated circuit having a signal output terminal; having an amplifier connected to a power supply terminal having an amplifier input terminal connected to a semiconductor element provided in said integrated circuit and having an amplifier output terminal connected to said signal output terminal through a coupling capacitor; and having a D.C. voltage generator which includes a bias voltage output terminal, a first impedance connected between said bias voltage output terminal and said power supply terminal, a second impedance connected between said bias voltage output terminal and a ground terminal, a D.C. voltage bias circuit comprising:
- a third impedance; and
- a depletion mode MOS transistor connected at its source-drain path between said bias voltage output terminal of said D.C. voltage generator and said signal output terminal and coupled at its gate electrode to either its source or its drain through said third impedance.

3. In an integrated circuit including a first amplifier connected to a power supply terminal having an amplifier input terminal connected to a semiconductor element provided in said integrated circuit and having an amplifier output terminal; and including a second amplifier connected to said power supply terminal having an amplifier input terminal and having an amplifier output terminal connected to another semiconductor element provided in said integrated circuit, a D.C. voltage bias circuit comprising:
- an impedance;
- a depletion mode MOS transistor connected at its source-drain path between the output terminal of said first amplifier and the input terminal of said second amplifier and coupled at its gate electrode to either its source or its drain through said impedance;
- a ground terminal;
- a filter terminal;
- a capacitor;
- the input terminal of said second amplifier connected to said ground terminal through said filter terminal and said capacitor, said D.C. voltage bias circuit constituting a low pass filter jointly with said filter terminal and said capacitor serving to supply to the input terminal of said second amplifier the D.C. component voltage of the output of said first amplifier by eliminating the A.C. component voltage of the output of said first amplifier in said low pass filter.

* * * * *